(12) United States Patent
Alani et al.

(10) Patent No.: US 6,388,262 B1
(45) Date of Patent: May 14, 2002

(54) DOUBLE TILT AND ROTATE SPECIMEN HOLDER FOR A TRANSMISSION ELECTRON MICROSCOPE

(75) Inventors: Reza Alani, Pleasanton; Barbara Louise Armbruster, Livermore; Richard John Mitro, San Ramon; Leszek Malaszewski, Walnut Creek, all of CA (US); Robert Michael Kozar, Prospect; Ronald Zolkowski, Pittsburgh, both of PA (US); Shigeru Suzuki, Tachikawa (JP)

(73) Assignee: Gatan, Inc., Pleasanton, CA (US)

( * ) Notice: Subject to any disclaimer, the term of this patent is extended or adjusted under 35 U.S.C. 154(b) by 0 days.

(21) Appl. No.: 09/373,515

(22) Filed: Aug. 12, 1999

Related U.S. Application Data

(60) Provisional application No. 60/096,215, filed on Aug. 12, 1998.

(51) Int. Cl.$^7$ .............................. G21K 5/10; G01N 23/00
(52) U.S. Cl. .................................. 250/442.11; 250/311
(58) Field of Search ......................... 250/442.11, 443.1, 250/311

(56) References Cited

U.S. PATENT DOCUMENTS

| | | |
|---|---|---|
| 4,292,523 A | 9/1981 | Hoppe |
| 4,672,797 A | 6/1987 | Hagler |
| 4,703,181 A | 10/1987 | Swann et al. |
| 4,771,178 A | 9/1988 | Egle et al. |
| 4,797,261 A | 1/1989 | Swann et al. |
| 4,950,901 A | 8/1990 | Jones et al. |
| 4,996,433 A * | 2/1991 | Jones et al. ............... 250/443.1 |
| 5,264,705 A | 11/1993 | Honda et al. |
| 5,367,171 A | 11/1994 | Aoyama et al. |
| 5,412,503 A | 5/1995 | Nederlof |
| 5,591,980 A | 1/1997 | Ogasawara et al. |
| 5,753,924 A | 5/1998 | Swann |
| 5,922,179 A | 7/1999 | Mitro et al. |

FOREIGN PATENT DOCUMENTS

| | | |
|---|---|---|
| DE | 28 25 417 | 11/1979 |
| EP | 0 226 804 | 7/1987 |
| EP | 0 423 877 | 4/1991 |
| EP | 0 690 474 | 1/1996 |

OTHER PUBLICATIONS

Tomoki Akita et al., "A New Specimen Holder for UHV–Reflection Electron Microscopy" Journal of Electron Microscopy, JP, Japanese Society for Electron Microscopy, Tokyo, vol. 43, No. 5, Oct. 1994, pp. 332–336.

J.P. Chalcroft and C.L. Davey, "A simply constructed extreme–tilt holder for the Philips eucentric goniometer stage", Journal of Microscopy, vol. 134, Pt 1, Apr. 1984, pp. 41–48.

Section 2 Bearing and lubricants, "Bearing basics" Mechanical Drives Reference Issue, p. 119.

"Selecting spherical bearing" Machine Design, Oct. 16, 1986, p. 136.

(List continued on next page.)

Primary Examiner—Bruce Anderson
(74) Attorney, Agent, or Firm—Killworth, Gottman, Hagan & Schaeff, L.L.P.

(57) ABSTRACT

A side-entry specimen holder for transmission electron microscopy is provided. The specimen holder is capable of rotating a specimen and tilting it in two axes. The specimen, when mounted in the holder, can be tilted in the plus/minus direction of the X-axis, the plus/minus direction of the Y-axis, and simultaneously have the ability of 360° rotation in the axis of the electron beam to permit alignment of microstructural features of the specimen for optimal viewing and analysis.

29 Claims, 9 Drawing Sheets

OTHER PUBLICATIONS

Document obtained from the Internet regarding "Model 643/646 Analytical", Jun. 11, 1998, pp. 1–3.

Brochure entitled "Model 675 Twin Double Tilt Holder", 675–8802–10 k.

Document obtained from the Internet regarding "Models 643 and 646 Analytical TEM Holders", Dec. 4, 1996, pp. 1–3.

Document obtained from the Internet regarding "Model 628 Single Tilt 1300 C Heating Holder", Dec. 4, 1996, pp. 1–3.

Brochure entitled "Model 613 Single Tilt and Model 636 Double Tilt Cooling Holders", 613/636–8802–10 k.

Document obtained from the Internet regarding "Model 613 Single Tilt and Model 636 Double Tilt Cooling Holders", Dec. 4, 1996, pp. 1–3.

Document obtained from the Internet regarding "Specimen Holders", Jun. 11, 1998, 1 pg.

* cited by examiner

DOUBLE TILT AND ROTATE SPECIMEN HOLDER FOR A TRANSMISSION ELECTRON MICROSCOPE

CROSS REFERENCE TO RELATED APPLICATION

This patent application claims the benefit of U.S. Provisional Application Ser. No. 60/096,215, filed Aug. 12, 1998.

BACKGROUND OF THE INVENTION

The present invention relates to specimen holders for transmission electron microscopes, and more particularly to side-entry specimen holders which are tiltable about two axes and rotatable about the electron beam axis.

In recent years, analytical specimen holders used in transmission electron microscopy (TEM) have become more widely used because of their simple and reliable mechanisms; however, as the technology of new materials advances so do requirements for TEM specimen viewing and specimen positioning. Conventional side entry TEM specimen holders have been developed which are capable of only a single axis tilt, which is the simplest type of specimen holder. In this form, the specimen is fixed to the specimen holder tip and has no means of independent motion. Tilting of the specimen in this axis (i.e., the longitudinal axis of the specimen holder) is accomplished by tilting the complete specimen holder about this axis in either direction. As technology has improved, the need for a second axis tilt (i.e., the axis perpendicular to the longitudinal axis of the specimen holder) of the specimen in addition to the first axis tilt became apparent and led to the development of double tilt specimen holders which are commercially available today. Double tilt specimen holders combine the two tilt axes as described above with the second axis tilt in either direction typically accomplished by movement of a drive rod mechanically coupled to a cradle supported by two pivot pins (axles).

TEM studies involving selected-area diffraction, stereo imaging, diffraction-contrast analysis, domain structure analysis and electron tomography all require precise of the specimen orientation. Single-tilt and double tilt holders are normally inadequate for these applications since the specimen orientation requires both tilting and rotation. Planar features such as interfaces and grain boundaries within a TEM specimen are most easily studied and analyzed if the specimen is first rotated until the planar feature is aligned parallel to the main tilt axis of the specimen holder. Such single tilt and rotate holders are also commercially available such as the Model 650 Single Tilt Rotate Specimen Holder available from Gatan, Inc. of Pleasanton, Calif. Stereological studies of crystalline materials have been hindered in that single tilt and rotate holders were limiting in use due to lack of a second axis tilt mechanism. Such stereological studies are complicated by the contrast change that occurs when a specimen is tilted. To minimize this effect, the specimen can first be rotated so that the g vector principally responsible for the contrast is aligned parallel to the tilt axis. The specimen can then be tilted without substantially altering the diffraction-contrast conditions. However, this involves manually changing the position of the specimen while outside of the transmission electron microscope (i.e., requires specimen unloading and re-loading) to attain proper alignment. The ability to tilt in two axes and rotate a specimen containing a feature (interface) to align the feature in the direction of various microscope detectors can facilitate feature analysis in the TEM. Moreover, the use of CCD cameras for TEM digital imaging makes it desirable to be able to rotate the specimen in a specific direction (visual image alignment) for a given crystallographic condition.

Thus, there remains a need in this art for a specimen holder which is able not only to rotate a specimen to obtain any desirable direction, but also to be able to tilt such a specimen in two tilt axes while viewing the specimen in a TEM.

SUMMARY OF THE INVENTION

The present invention meets that need by providing a side-entry specimen holder for transmission electron microscopy capable of rotating a specimen and tilting it in two axes. The specimen, when mounted in the holder, can be tilted in the plus/minus direction of the first (longitudinal) axis, the plus/minus direction of the second (normal to longitudinal) axis, and simultaneously have the ability of continuous 360° rotation in the axis of the electron beam to permit alignment while viewing the specimen in the TEM. Further, because of the provision for rotation of the specimen, the viewing axis of the specimen may be aligned to the first or second axis, permitting very high tilt angles.

In accordance with one aspect of the present invention, a side-entry specimen holder for a transmission electron microscope is provided and includes a specimen holder having a specimen cradle, a cradle frame, and a drive shaft connected to the specimen cradle and frame; a first tilt mechanism for tilting the specimen holder about a first longitudinal axis; a second tilt mechanism for tilting the specimen cradle about a second axis normal to the first axis; and a rotation mechanism for rotating the specimen cradle. In a preferred form, tilting in the first axis is accomplished by tilting the entire specimen holder. A preferred first tilt mechanism comprises a drive for rotating the support arm about its longitudinal axis. The second tilt mechanism comprises a drive for moving a drive shaft which is linked through a spherical bearing to a frame housing the specimen cradle. The frame for the specimen cradle also preferably includes a support arm (barrel).

The rotation mechanism may be any of a number of mechanisms which are described below and may be endless (full 360°) or limited in rotation. However, a preferred rotation mechanism comprises a pinion drive gear mating with a ring gear. The specimen cradle includes the ring gear about its periphery, which is engaged and driven by the pinion gear to provide for the rotation of the cradle.

In accordance with another aspect of the invention, a method for analyzing one or more physical features of a specimen in a transmission electron microscope is provided and includes the steps of mounting a specimen to be analyzed in a holder capable of tilting in two axes and rotation, inserting the holder and specimen into the path of an electron beam from the transmission electron microscope, rotating the specimen in the holder to align a physical feature of interest relative to a first tilt axis, and tilting the holder in both of the first and second axes to analyze said physical feature. The physical feature of interest may include microstructural features selected from the group consisting of grain boundaries, precipitates, and interfaces in crystalline materials. Optionally, the method includes the step of analyzing the specimen when tilted about the first axis, rotating the specimen in the holder while in the transmission electron microscope to align the physical feature of the specimen to the second axis, tilting the specimen about the second axis, and performing further analysis of the specimen. Another aspect of the invention provides a method for analyzing one or more physical features of a specimen in a transmission electron microscope and includes the steps of mounting a specimen to be analyzed in a holder capable of tilting in two axes and rotation, inserting the holder and specimen into the path of an electron beam from the transmission electron microscope (TEM), rotating the specimen in the holder to align a physical feature of interest with a TEM detector, and tilting the holder in both of the first and second axes to analyze the physical feature.

Accordingly, it is a feature of the present invention to provide a side-entry specimen holder for transmission electron microscopy capable of rotating a specimen and tilting it in two axes. This, and other features and advantages of the present invention, will become apparent from the following detailed description and the accompanying drawings.

DETAILED DESCRIPTION OF THE PREFERRED EMBODIMENTS

The present invention will be described in detail with respect to its preferred embodiment which is as a side-entry specimen holder for a transmission electron microscope. It will be apparent that the specimen holder may be adapted to operate in other types of electron and ion microscopes and related instruments. Further, as is conventional in this art, the specimen holder of the present invention may be modified to include either heating or cooling (e.g., cryogenic) capabilities. The specimen holder is designed to be inserted into the column of an electron microscope so that the specimen carried thereon may be aligned with an electron beam which traverses the column.

Figure 1:
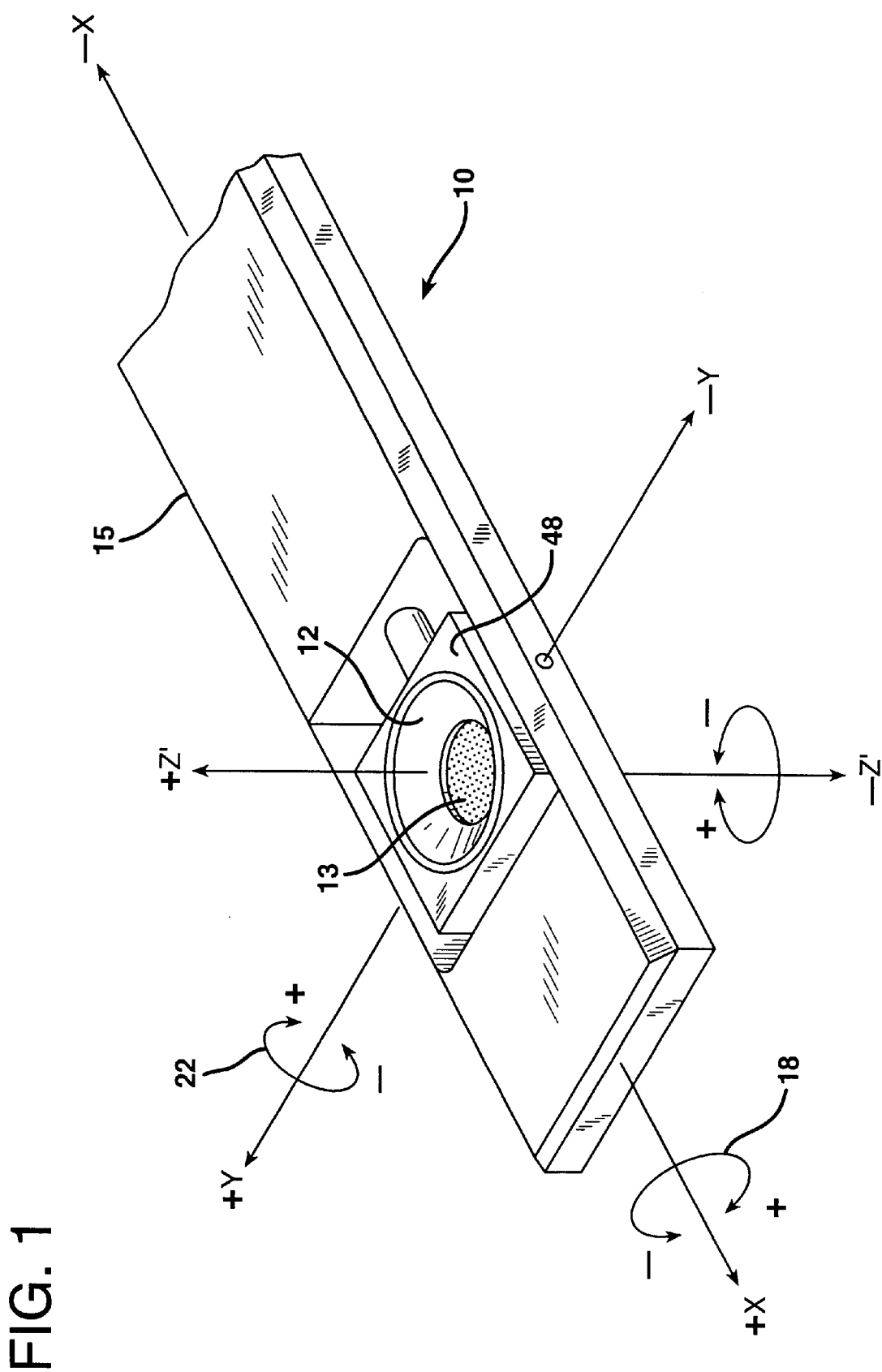
FIG. 1 is a schematic perspective view of the distal end of the specimen holder illustrating the ability of the holder to tilt in two axes (longitudinal and normal to longitudinal) and rotate about the axis of the electron beam (Z-axis)
Figure 2:
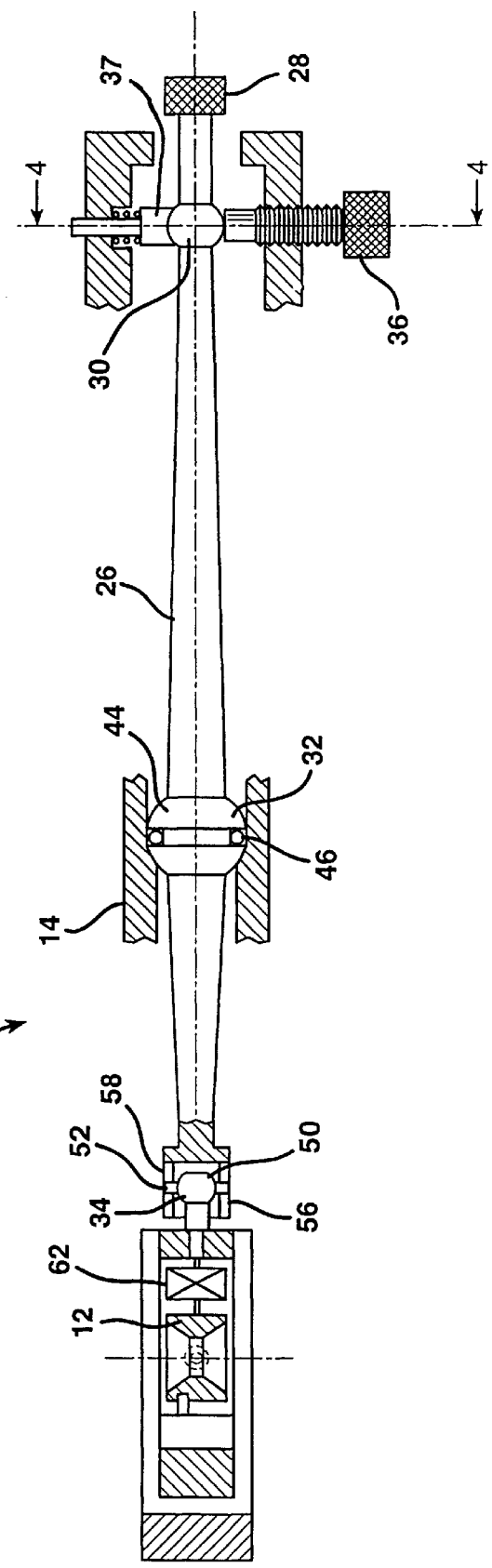
FIG. 2 is a side view, in section, of one embodiment of the specimen holder.

As shown in FIG. 1, a distal end or tip of specimen holder 10 includes a specimen cradle 12 contained in a frame 48. As is conventional, the specimen 13, which has been previously prepared, is mounted in the specimen holder tip 15 secured in cradle 12. For purposes of this invention, and as illustrated in FIG. 1, the X-, Y-, and Z-axes of movement of the specimen holder are defined as follows. The X-axis refers to the longitudinal axis of specimen holder 10, with movement toward the distal end or tip of specimen holder 10 being defined as the positive (+) direction and movement in the opposite direction being defined as the minus or negative (−) direction. Tilting of the specimen holder may occur in a first tilt axis 18 defined as the α-tilt (and also referred to as X-axis tilt) in either a clockwise (+) or counterclockwise (−) direction as shown.

The Y-axis is defined as the axis of the specimen holder which is perpendicular to the longitudinal axis, with minus and positive conventions as shown. Tilting of the specimen cradle may also occur in a second tilt axis 22, defined as the Stilt (and also referred to as Y-axis tilt) in either a clockwise (+) or counterclockwise (−) direction. Finally, specimen cradle 12 may be rotated about the vertical (Z-) axis in either the positive (+) clockwise direction or minus (−) counterclockwise direction as shown.

Referring now to FIGS. 2–5, a first embodiment of the invention is illustrated wherein specimen holder 10 includes a specimen cradle 12 which is contained within frame 48 and which is connected, through appropriate linkages 30, 32, 34, to a support arm 14. As shown, a tilting of the entire specimen holder in either a clockwise (+) or counterclockwise (−) direction causes frame 48 and specimen cradle 12 to tilt about the X-axis. The linkages are such that any rotation, such as by rotating knob 28 or a drive mechanism (not shown), results in a direct and corresponding rotation of specimen cradle 12 in the direction of the rotation.

Tilting of frame 48 and cradle 12 in the Y-axis is accomplished by rotation of tilt screw knob 36. As shown, linkage 30 comprises a spherical bearing and a bracket 37. Linkage 30 is biased against drive shaft 26 by a spring 42. Rotation of knob 36 in one direction causes the opposite end of the screw to bear against and move drive shaft 26 upwardly from the position shown in FIG. 2. Conversely, rotation of the knob in the opposite direction causes the end of the screw to retract away from drive shaft 26, permitting spring 42 to bias linkage 30 downward and move drive shaft 26 in the same downward direction.

Figure 5:
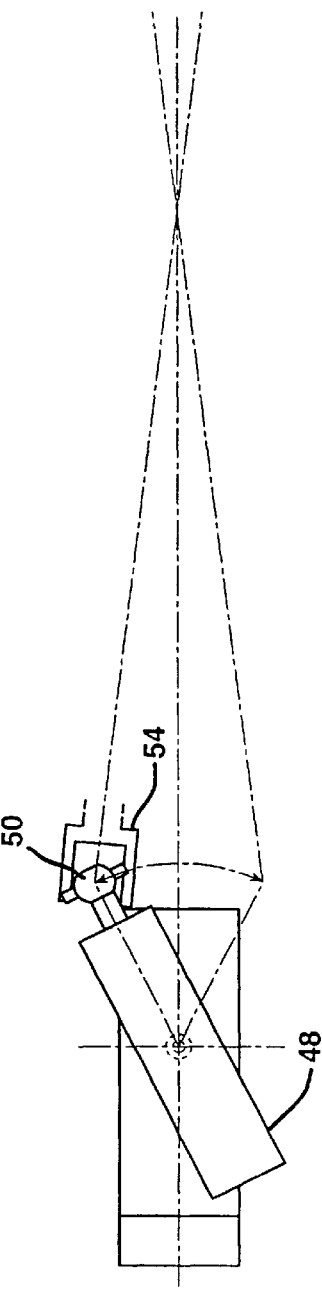
FIG. 5 is a side view of the specimen holder illustrating the operation of the tilt mechanism about the second axis.

Linkage 32 comprises a spherical bearing 44 and O-ring vacuum seal 46 which permit drive shaft 26 to pivot within a widened opening in support arm housing 14 as shown. Vertical movement of drive shaft 26, either upwardly or downwardly, causes linkage 34 to act on frame 48 as shown in FIG. 5. That is, linkage 34 includes a spherical bearing 50 having a pin 52 therein. The opposite ends of pin 52 are captured in slots 56,58 of clevis 54 which is carried on the distal end of drive shaft 26. When the distal end of drive shaft 26 moves upwardly, frame 48 tilts downwardly (in the minus (−) direction), and vice versa as best shown in FIG. 5.

Figure 3:
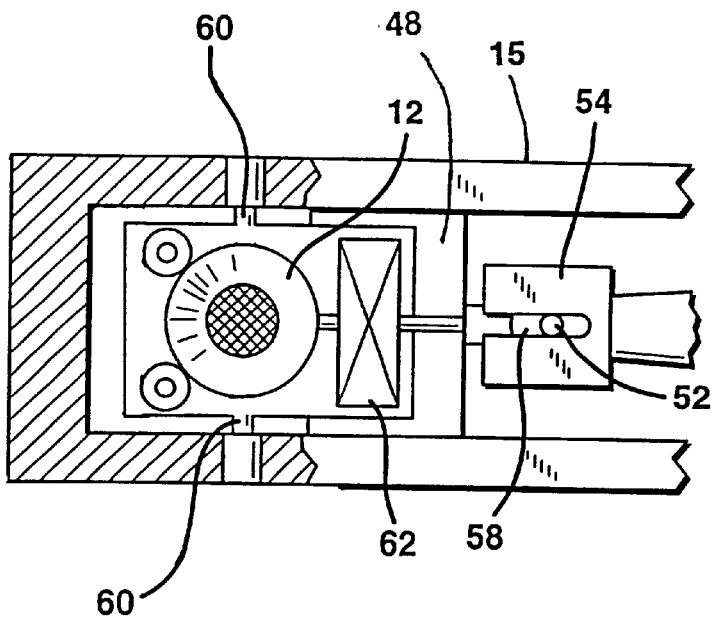
FIG. 3 is a top view, in section, of the distal end of one embodiment of the specimen holder.
Figure 4:
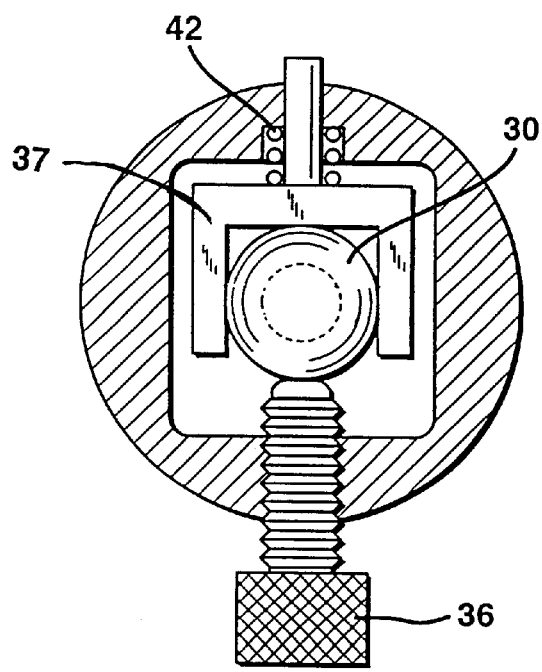
FIG. 4 is a sectional view taken along line 4—4 in FIG. 2.

As shown in FIG. 3, frame 48 is mounted in specimen tip 15 using axles 60 which are captured in corresponding holes. This permits frame 48 to tilt about the Y-axis. The rotation of knob 36 may be calibrated in a known manner to provide predictable and accurate angles of tilt of the specimen in the Y-axis.

Figure 6:
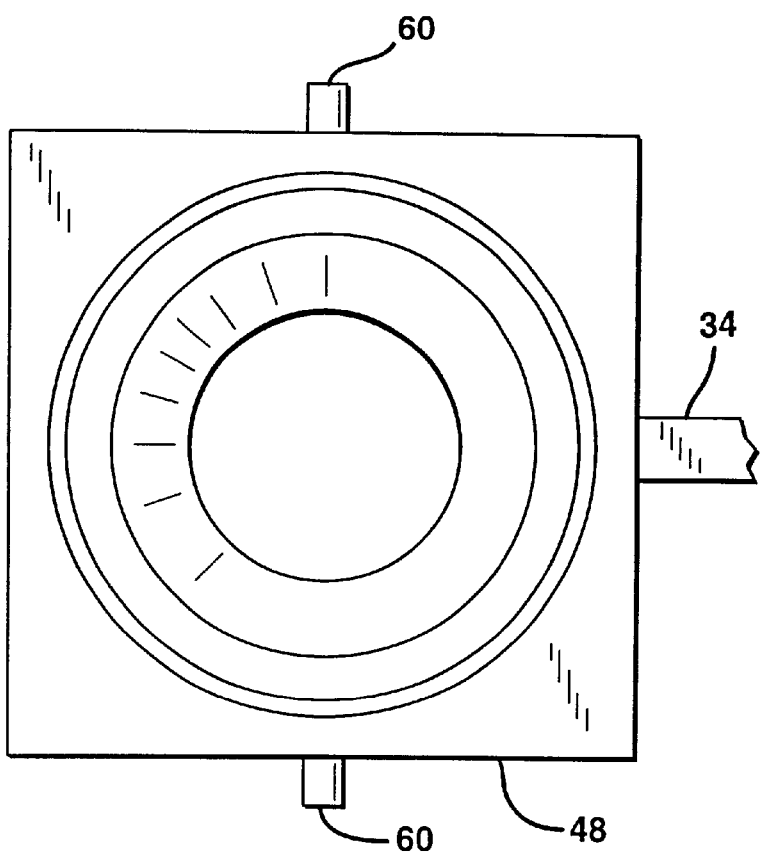
FIG. 6 is a top view of the specimen cradle and a preferred gear drive mechanism.
Figure 7:
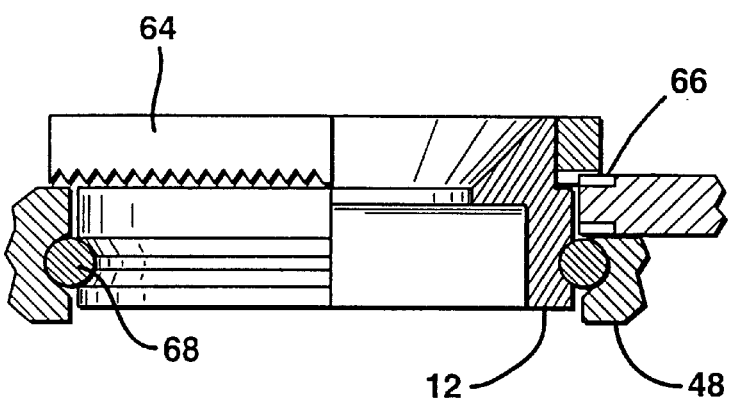
FIG. 7 is a side view, in section, of the specimen cradle and the preferred gear drive mechanism of FIG. 6.

Rotation of the specimen is accomplished by providing a motion exchange mechanism 62 which is linked to specimen cradle 12. Motion exchange mechanism 62 may comprise a gear mechanism, a friction drive, a belt drive, a cam ribbon mechanism, a spherical drive, or other suitable device to cause cradle 12 to rotate about its vertical axis. A preferred embodiment of the motion exchange mechanism is shown in FIGS. 6 and 7. Specimen cradle 12 includes ring gear 64 which is engaged and driven by pinion gear 66 coupled through linkage 34. A groove 68 and spring loaded balls serve to stabilize the rotation of cradle 12.

Figure 8:
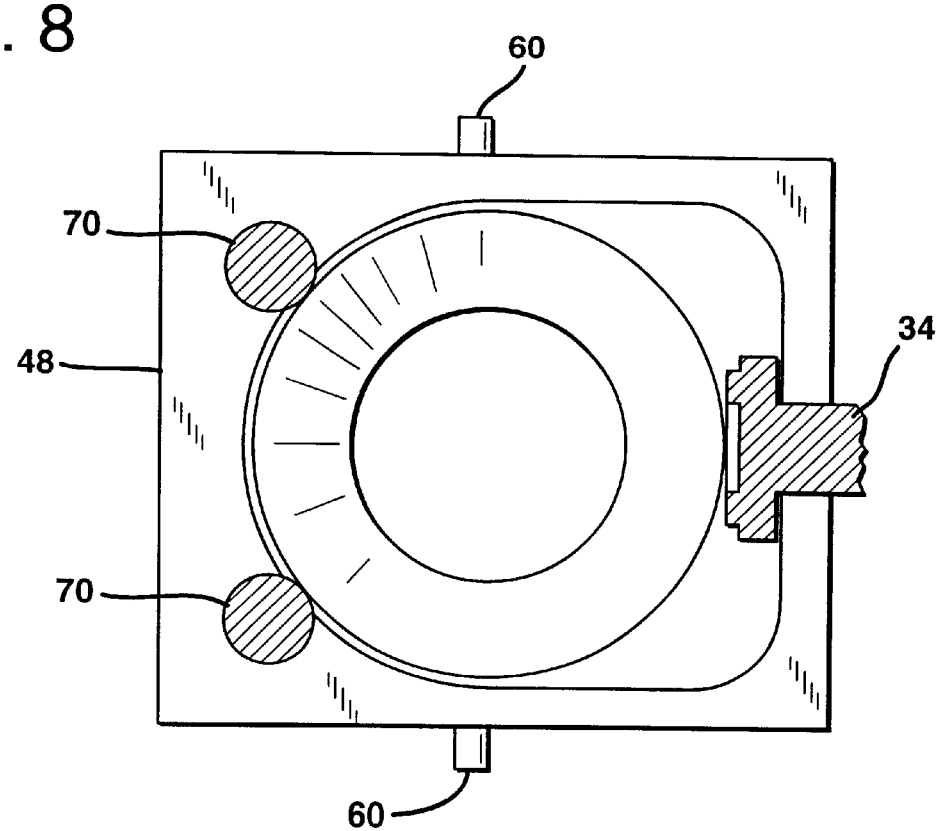
FIG. 8 is a top view of the specimen cradle and a friction drive mechanism.
Figure 9:
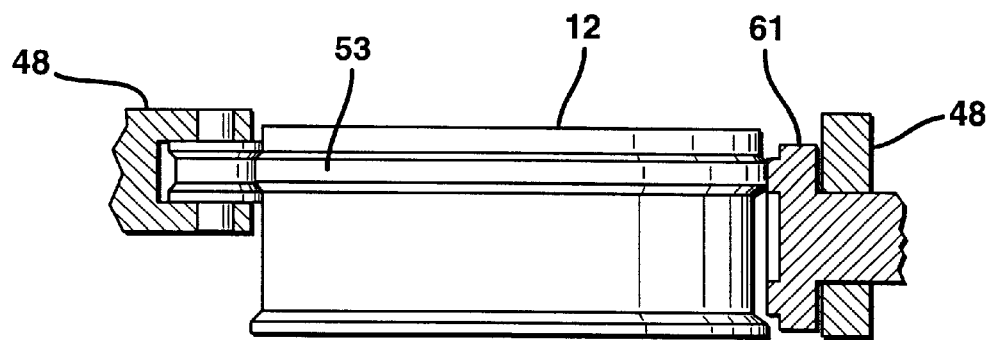
FIG. 9 is a side view, in section, of the specimen cradle and the friction drive mechanism of FIG. 8.

An embodiment of the invention which uses a friction drive for the motion exchange mechanism is shown in FIGS. 8 and 9. Specimen cradle 12 includes a rim 53 which is engaged by a friction plate 61 to rotate the cradle. Guide rollers 70 support cradle 12. The specimen cradle is tilted by linkage 34 pivoting the frame 48 on axles 60.

Figure 10:
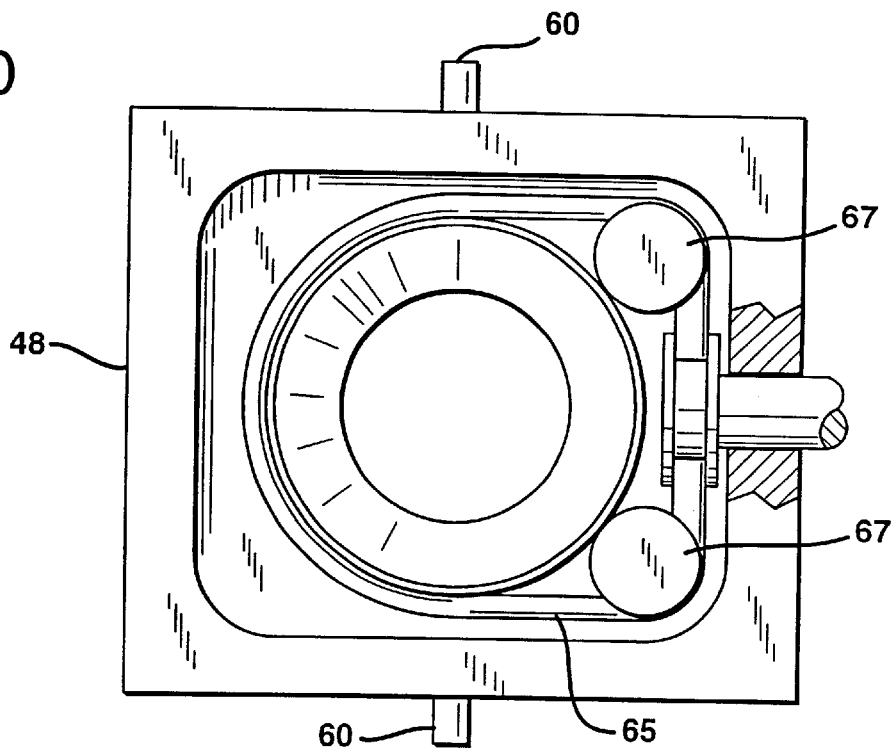
FIG. 10 is a top view of the specimen cradle and a belt drive mechanism.
Figure 11:
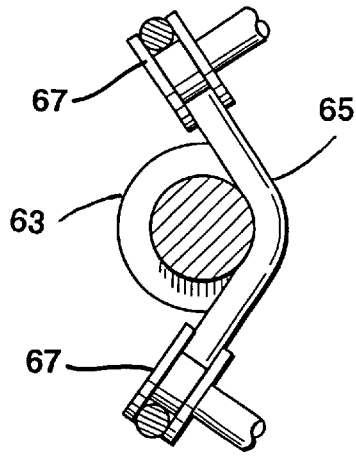
FIG. 11 is a partial side view, in section, of the belt drive mechanism of FIG. 10.
Figure 12:
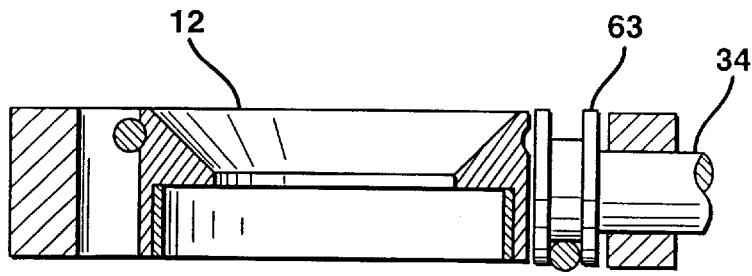
FIG. 12 is a side view, in section, of the specimen cradle and the belt drive mechanism of FIG. 10.

An embodiment of the invention which uses a belt drive for the motion exchange mechanism is shown in FIGS. 10, 11, and 12. Specimen cradle 12 includes a groove that is engaged and rotated by belt 65 which may comprise a flexible material such as metal or synthetic materials. Belt 65 is in turn driven by pulley 63. Pulley guides 67 change the direction of the belt coming off of pulley 63. The specimen cradle 12 is tilted by linkage 34 pivoting the frame 48 on axles 60.

Figure 13:
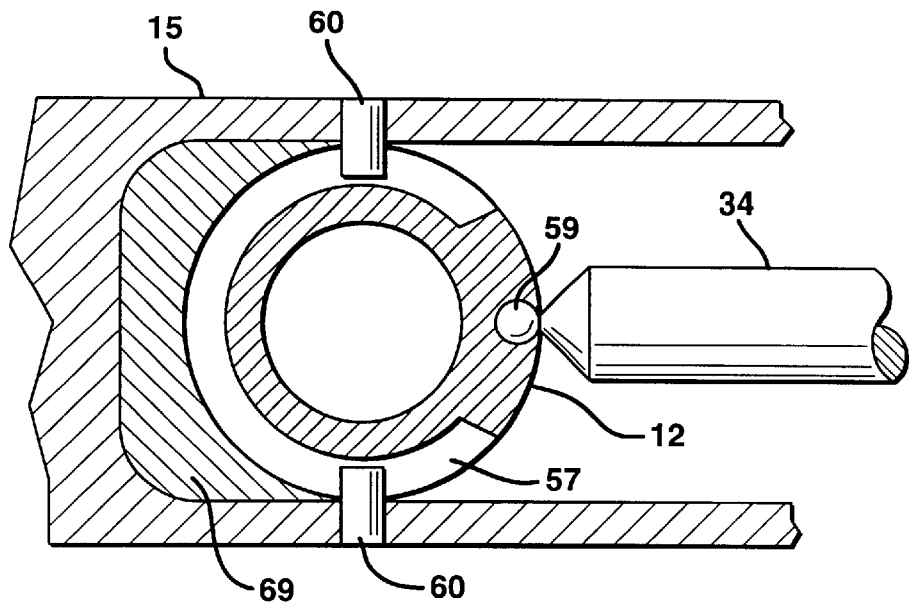
FIG. 13 is a top view of the specimen cradle and a spherical drive mechanism.
Figure 14:
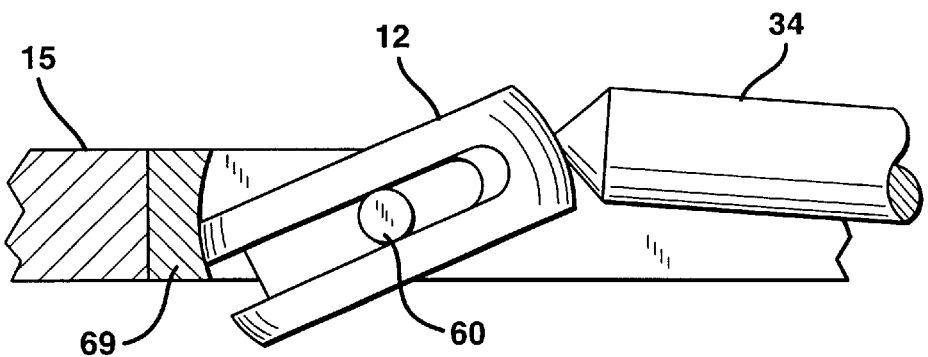
FIG. 14 is a side view, in section, of the specimen cradle and the spherical drive mechanism of FIG. 13.

An embodiment of the invention which uses a spherical drive for the motion exchange mechanism is shown in FIGS. 13 and 14. Specimen cradle 12 is tilted and rotated by linkage 34. Pivoting the linkage 34 up and down provides the Y-axis tilt while pivoting side-to-side provides rotation for the cradle. Specimen cradle 12 is retained within a spherically-shaped guide bushing 69. Coupling between cradle 12 and linkage 34 is by ball-and-socket joint 59. Specimen cradle 12 pivots and rotates about two pins (axles) 60 fixed into specimen tip 15 and ride in a circular groove 57 in the circumference of cradle 12.

Figure 15:
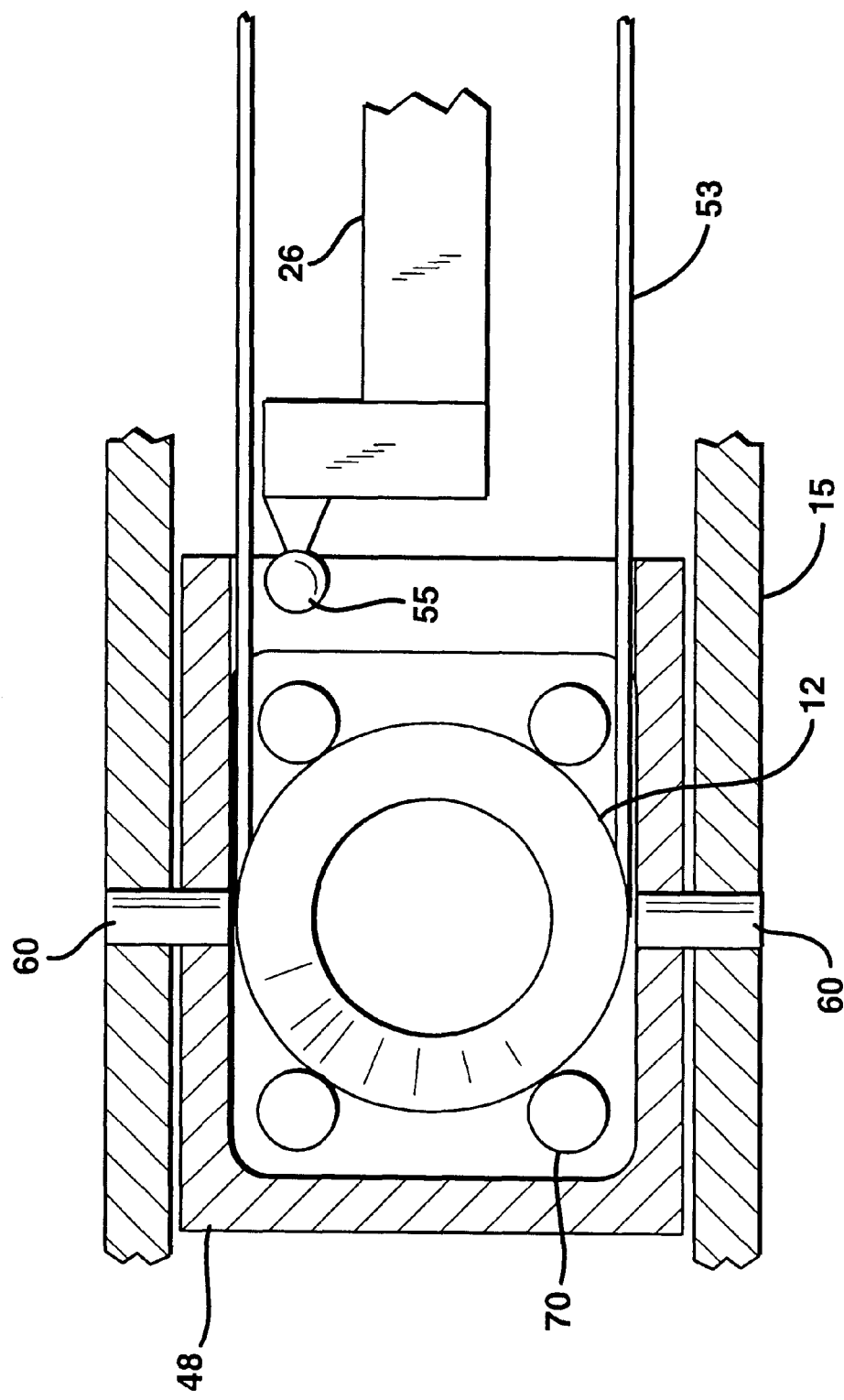
FIG. 15 is a top view of the specimen cradle and a ribbon drive mechanism.

An embodiment of the invention which uses a ribbon drive for the motion exchange mechanism is shown in FIG. 15. Rotation of specimen cradle 12 is provided by a ribbon 53 passing around the cradle at the tip end of holder 15 and around a drive pulley at the opposite distal end of the holder (not shown). Rollers 70 retain the specimen cradle 12 in position. Rotating drive shaft 26 having an offset spherical ball contact 55 at its end tilts specimen cradle 12. Ball contact 55 moves within a linear slot in frame 48 allowing the cradle 12 to tilt about axles 60 and provide Y-axis tilt. In this embodiment, drive shaft 26 does not provide rotation about the Z-axis to cradle 12.

Figure 16:
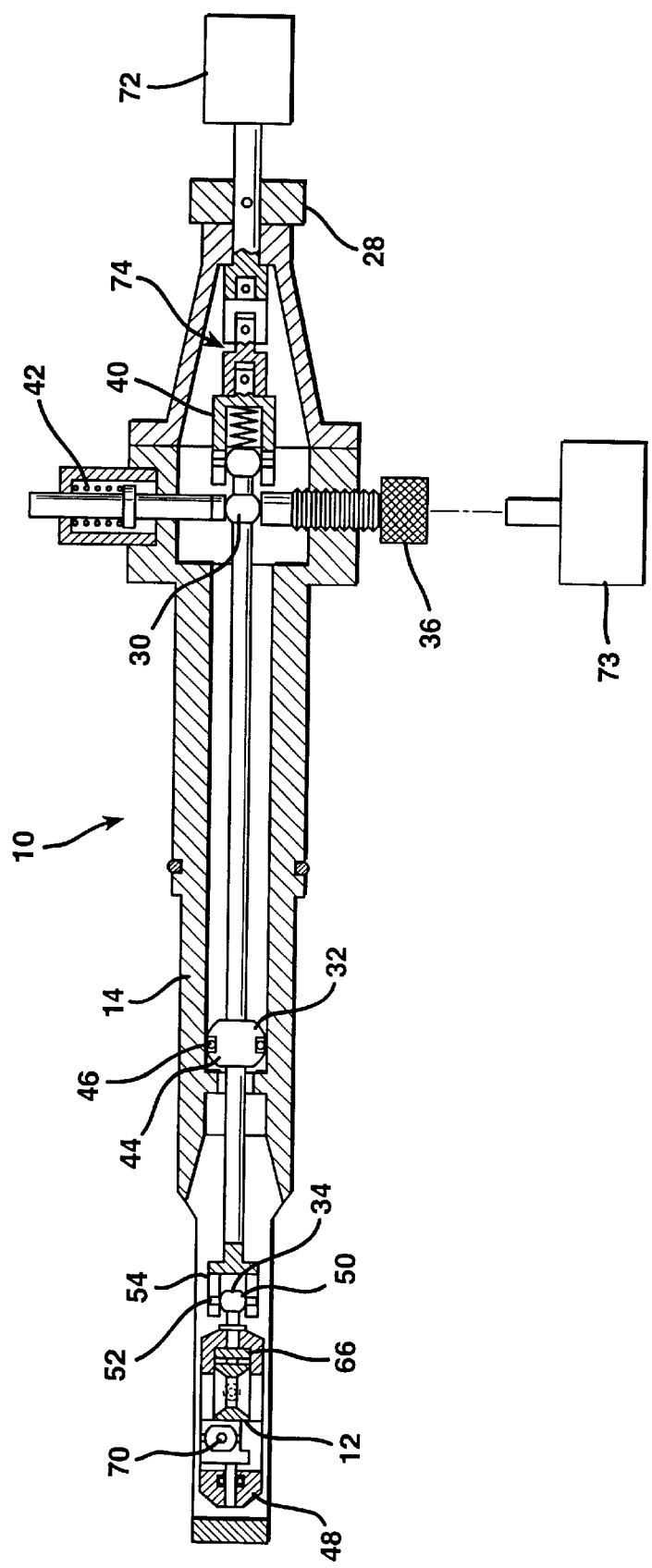
FIG. 16 is a side view, in section, of another embodiment of the specimen holder.

Another embodiment of the invention is shown in FIG. 16, where like elements are represented by like reference numerals. In this embodiment, rotation knob 28 is linked to a drive mechanism 72 to provide motorized rotation of the specimen cradle about the Z-axis. A universal joint and clevis coupling, generally indicated at 74 and 40, respectively, is positioned between drive 72 and linkage 30. A motor drive 73 operates to rotate knob 36 to provide tilt along the Y-axis.

In operation, after mounting the specimen in the holder, the holder is inserted into a column of an electron microscope where the position of the specimen is aligned with the electron beam. Where specific planar features of the specimen are desired to be observed and imaged, the specimen is first rotated, using motion exchange mechanism 62, so that the interface orientation in the specimen, such as the g vector which is principally responsible for contrast, is aligned parallel to the tilt axis. The specimen may then be studied from numerous angles by utilizing the X- and Y-axis tilt mechanisms, and specimen rotation, respectively.

Typically, the X-axis tilt angle range may be greater than ±80°, while the Y-axis tilt angle range may be up to about ±60°. Thus, the specimen can be tilted in both the plus/minus direction of the X-axis as well as the plus/minus direction of the Y-axis. Further, because of the ability to rotate the specimen through 360°, the viewing axis of the specimen may be aligned to the X- or Y-axis, permitting very high tilt angles.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A side-entry specimen holder for a transmission electron microscope comprising,
   a specimen holder including a specimen cradle, a frame for said specimen cradle, and a drive shaft connected to said specimen cradle and said frame;
   a first tilt mechanism for tilting said specimen holder about a first axis;
   a second tilt mechanism for tilting said specimen cradle about a second axis; and
   a motion exchange mechanism for rotating said specimen cradle about the vertical axis of said cradle.

2. A specimen holder as claimed in claim 1 in which said drive shaft acts as the motion exchange mechanism for said second tilt mechanism and for rotating said specimen cradle.

3. A specimen holder as claimed in claim 2 in which said drive shaft comprises a spherical bearing.

4. A specimen holder as claimed in claim 3 in which said spherical bearing contains an O-ring.

5. A specimen holder as claimed in claim 2 in which said drive shaft for tilting said specimen cradle and for rotating said specimen cradle is activated by a mechanical mechanism.

6. A specimen holder as claimed in claim 2 in which said mechanical mechanism for tilting said specimen cradle about said second axis comprises a manually driven screw.

7. A specimen holder as claimed in claim 2 in which said mechanical mechanism comprises a motor driven screw.

8. A specimen holder as claimed in claim 5 in which said mechanical mechanism for rotating said specimen cradle comprises a manually driven shaft.

9. A specimen holder as claimed in claim 8 in which said mechanical mechanism for rotating said specimen cradle comprises a motor driven shaft.

10. A specimen holder as claimed in claim 5 in which said drive shaft includes a linkage to said mechanical mechanism comprising a universal joint.

11. A specimen holder as claimed in claim 1 in which said second tilt mechanism comprises said frame for said specimen cradle, said frame being linked to said drive shaft.

12. A specimen holder as claimed in claim 1 in which said motion exchange mechanism links said specimen cradle to said drive shaft.

13. A specimen holder as claimed in claim 1 in which said motion exchange mechanism comprises a pinion gear and a ring gear.

14. A specimen holder as claimed in claim 13 in which said specimen cradle includes a bearing about its periphery.

15. A specimen holder as claimed in claim 1 in which said motion exchange mechanism comprises a friction drive wheel and a drive surface.

16. A specimen holder as claimed in claim 15 in which said specimen cradle is coupled to roller guides about its periphery to retain said cradle.

17. A specimen holder as claimed in claim 1 in which said motion exchange mechanism comprises pulleys and a belt.

18. A specimen holder as claimed in claim 17 in which said belt is comprised of a flexible material.

19. A specimen holder as claimed in claim 1 in which said motion exchange mechanism comprises a spherical drive, said spherical drive including a drive shaft and said specimen cradle has a spherical diameter which mates with a spherical housing.

20. A specimen holder as claimed in claim 19 in which said coupling between said cradle and said drive shaft comprises a ball and socket.

21. A specimen holder as claimed in claim 20 in which said cradle pivots and rotates about a pair of axles in said specimen holder which extend into a circular groove in the circumference of said cradle.

22. A specimen holder as claimed in claim 1 in which said motion exchange mechanism comprises a ribbon drive including a ribbon pass around said cradle.

23. A specimen holder as claimed in claim 22 in which said ribbon comprises an endless ribbon.

24. A specimen holder as claimed in claim 23 in which said endless ribbon passes around said cradle and a drive pulley.

25. A specimen holder as claimed in claim 22 in which said specimen cradle is coupled to roller guides positioned about its periphery to retain said cradle in said frame.

26. A method for analyzing one or more physical features of a specimen in a transmission electron microscope comprising mounting a specimen to be analyzed in a holder, inserting said holder and specimen into the path of an electron beam from the transmission electron microscope, rotating said holder about its vertical axis to align a physical feature of interest of the specimen relative to a first tilt axis, and tilting said holder in both of first and second tilt axes to analyze said physical feature.

27. A method as claimed in claim 26 wherein said physical feature comprises microstructural features selected from the group consisting of grain boundaries, precipitates, and interfaces in crystalline materials.

28. A method as claimed in claim 26 including analyzing said specimen when tilted about said first tilt axis, rotating said specimen in said holder while in said transmission electron microscope to align said physical feature of said specimen to said second tilt axis, tilting said specimen about said second tilt axis, and performing further analysis of said specimen.

29. A method for analyzing one or more physical features of a specimen in a transmission electron microscope comprising mounting a specimen to be analyzed in a holder, inserting said holder and specimen into the path of an electron beam from the transmission electron microscope, rotating said holder about its vertical axis to align a physical feature of interest of said specimen with a TEM detector, and tilting said holder in both of first and second tilt axes to analyze said physical feature.

\* \* \* \* \*

UNITED STATES PATENT AND TRADEMARK OFFICE
CERTIFICATE OF CORRECTION

PATENT NO. : 6,388,262 B1
DATED : May 14, 2002
INVENTOR(S) : Alani et al.

It is certified that error appears in the above-identified patent and that said Letters Patent is hereby corrected as shown below:

<u>Title page,</u>
Item [75], "Shigeru Suzuki, Tachikawa (JP)" should be -- Shigeru Suzuki, Tachikawa-ski (JP) --;

<u>Column 1,</u>
Line 42, "require precise of the specimen orientation" should be -- require precise control of the specimen orientation --;

<u>Column 4,</u>
Line 23, "Stilt" should be -- β-tilt --;

<u>Column 6,</u>
Line 40, "claim 2" should be -- claim 5 --;
Line 43, "claim 2" should be -- claim 6 --; and <u>Column 7,</u>
Line 22, "pass around" should be -- passing around --.

Signed and Sealed this

Twenty-ninth Day of October, 2002

Attest:

*Attesting Officer*

JAMES E. ROGAN
*Director of the United States Patent and Trademark Office*